(12) United States Patent
Taura et al.

(10) Patent No.: US 6,442,082 B2
(45) Date of Patent: Aug. 27, 2002

(54) VOLTAGE-LEVEL SHIFTER AND SEMICONDUCTOR MEMORY USING THE SAME

(75) Inventors: Tadayuki Taura, Zushi; Shigeru Atsumi, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/725,725

(22) Filed: Nov. 30, 2000

(30) Foreign Application Priority Data

Dec. 1, 1999 (JP) .......................................... 11-342573

(51) Int. Cl.[7] ................................................ G11C 7/00
(52) U.S. Cl. ............................... 365/189.11; 365/189.09
(58) Field of Search ....................... 365/189.11, 189.09; 326/68

(56) References Cited

U.S. PATENT DOCUMENTS 4,978,870 A * 12/1990 Chen et al. .................... 326/68
5,781,481 A * 7/1998 Iwakiri .................. 365/189.11
6,240,027 B1 * 5/2001 Lee et al. .............. 365/189.11

* cited by examiner

*Primary Examiner*—Vu A. Le
(74) *Attorney, Agent, or Firm*—Banner & Witcoff, Ltd.

(57) ABSTRACT

For achieving a voltage-level shifting operation provided are transistors controlled by an input signal for current restriction along a current path in a voltage-level shifter having a pair of PMOS transistors and another pair of NMOS transistors. The transistors for current restriction are NMOS transistors for shifting a low-level side of an input signal to a further low level and PMOS transistors for shifting a high-level side of an input signal to a further high level.

4 Claims, 8 Drawing Sheets

VOLTAGE-LEVEL SHIFTER AND SEMICONDUCTOR MEMORY USING THE SAME

CROSS REFERENCE TO RELATED APPLICATIONS

This application claims benefit of priority under 35USC §119 to Japanese Patent Application No. 1999-342573 filed on Dec. 1, 1999 in Japan, the entire contents of which are incorporated by reference herein.

BACKGROUND OF THE INVENTION

The present invention relates to a signal voltage-level shifter and a semiconductor memory using the shifter.

Several electrically-erasable non-volatile semiconductor memories (EEPROM) have been known. Each memory cell of EEPROMs is constituted by a MOS transistor having stacked floating and control gates. A memory cell array can be formed by connecting a plurality of memory cells in NOR- or NAND-type. Both types of memory cell array require several internal boosted high voltages and negative voltages according to operation mode, such as, data programming and erasing.

A NOR-type EEPROM operates as follows: Voltages at 5 V and 9 V are applied to the drain and the control gate, respectively, of a selected memory cell while the source is grounded, for data programming. This voltage application allows hot electrons to be injected into the floating gate to shift a threshold level of the selected memory cell toward a positive level, which is a programmed state, such as, a "0"-state.

Data programming includes a data verification operation to verify that data has been programmed. The verification operation applies a voltage, such as, 6.5 V, to the control gate, that is higher than that for a regular data reading operation to judge whether the programmed data is "0" or not. Data programming is performed again if programming is insufficient.

Concerning data erasing, all data are usually erased for each unit of block. Voltages at −7 V and 5 V are applied to the control gate and the common source, respectively, while the drain is floating in each memory cell in a selected block.

This voltage application allows electrons in the floating gate to be discharged to the source with a tunnel current to shift a threshold level of the selected memory cell toward a negative level, which is an erased state, such as, a "1"-state. The same can be done by applying, for example, 10 V to the source and well regions, electrons being discharged from the entire channel region with a tunnel current.

Data erasing also includes a data verification operation to verify that data has been erased. The verification operation applies a voltage, such as, 4 V, to the control gate, that is lower than that for a regular data reading operation to judge whether the memory cell in the erased block is "1" or not. Data erasing is performed again if insufficient.

Over-erasing occurs to memory cells that are easily erased among blocks to be erased. An over-erased memory cell, having a negative threshold level at which a current flows even at 0 V to the control gate, obstructs a regular reading operation due to a leakage from a non-selected cell when 0 V and a voltage for reading are applied to the control gates of the non-selected cell and a selected cell in a "0"-state, respectively, thus resulting in erroneous reading of a "1"-state from the "0"-state selected cell.

A weak programming is performed to ease an over-erased state of an over-erased memory cell. One technique is to apply 0 V and 5 V to the control gate and the corresponding bit line, respectively, to set memory cells connected to the bit line to meet a weak programming requirement. This technique utilizes potential rising at the floating gate due to capacitance-coupling from the drain, which is called a self-convergence technique due to that fact that electrons injected into the floating gate decrease its potential so that the programming requirement is not met.

Another technique to ease an over-erased state of an over-erased memory cell is to apply 3 V and 5 V to the control gate and the drain, respectively, to set selected memory cells to meet a weak programming requirement. This voltage application allows hot electrons to be injected into the floating of an over-erased memory cell to ease the over-erased state. This technique requires a voltage of, for example, −1.5 V, to the control gate of non-selected cells for non-selected over-erased cells not to be turned on.

FIG. 1 represents Vgs-to-Ids characteristics for several states of EEPROM as described above.

A normally programmed state "0" and a normally erased state "1" are represented by OFF and ON, respectively, for a voltage Vread for reading applied to the control gate. An over-erased state is a state in which electrons have been discharged until the threshold level becomes negative. Self convergence state (1) and weak program state (2) represent a weak programming and an active programming, respectively, under the self-convergence technique.

As discussed, EEPROMs use variety of voltages according to operation modes. EEPROMs have a chip-in-voltage booster for generating several high voltages and also a chip-in-voltage-level shifter in an address decoder for shifting VCC-VSS amplitude signal voltage to control voltages of several levels.

For example, as shown in a well-known circuit in FIG. 2, a first voltage-level shifter 2 and a second voltage-level shifter 3 are connected to the output of a row decoder 1 for selectively activating word lines.

The row decoder 1 performs an identification operation to addresses A0, A1, . . . , to output complimentary decode output signals "a" and "b" having an amplitude of VCC-VSS.

The signals "a" and "b" are supplied to the first voltage-level shifter 2 and converted into signals "A" and "B", respectively, having a potential VSW higher than the high level of the corresponding signal "a" or "b". The potential VSW is a high potential for programming and supplied by a voltage booster (not shown), which will become a potential Vread in reading.

The, signals "A" and "B" are supplied to the second voltage-level shifter 3 and converted into signals "OUTA" and "OUTB", respectively, having a potential VBB lower than the low level of the corresponding signal "A" or "B". At least either the signal "OUTA" or "OUTB" is supplied to a word line driver (not shown).

The first voltage-level shifter 2 consists of NMOS transistors QN1 and QN2 provided at the VSS-side, that receive the signals "a" and "b", respectively, and PMOS transistors QP1 and QP2 provided at the VSW-side. The transistors QP1 and QP2 constitute a flip-flop in which the gate and drains are cross-connected for positive feed-back to shift the high-level potential of the signals "a" and "b" from VCC to VSW.

The second voltage-level shifter 3 consists of PMOS transistors QP3 and QP4 provided at the high-level VSW-side, that receive the signals "A" and "B", respectively, and NMOS transistors QN3 and QN4 provided at the low-level VBB-side. The transistors QN3 and QN42 constitute a flip-flop in which the gate and drains are cross-connected to shift the low-level potential "A" and "B" from VSS to VBB.

The voltage-level shifters 2 and 3 are, however, are disadvantageous for an unstable switching operation in voltage-level shifting.

This disadvantage is discussed in detail with respect to the second voltage-level shifter 3 for low-level side shifting.

FIG. 3 represents voltage-to-current characteristics of the PMOS transistor QP3 and the NMOS transistor QN3. The curve C1 represents a static characteristic when a gate voltage Vg supplied to the NMOS transistor QN3 is VSW. The curve C2 is a load characteristic curve given by the PMOS transistor QP3 the conductance of which is controlled by the input signal "A".

The signs I1 and I2 represent a current at a voltage 0 V ("A"=VSS) to the PMOS transistor QP3 on the load characteristic curve C2 and a current at a voltage 0 V to the NMOS transistor QN3 on the static characteristic C1, respectively.

A normal voltage-level shifting for the second voltage-level shifter 3 must meet the requirement I1>I2. If I1≦I2, the transistors QP3 and QP4 are tuned off and on, respectively, thus the transistors QN3 and QN4 are tuned on and off, respectively, at "A"=VSW and "B"=VSS.

Inversion of the input signals to the second voltage-level shifter 3 hardly turns off and on the transistors QN3 and QN4, respectively. This is because the low level of the input signal "A" to the PMOS transistors QP3 is VSS, and, as indicated in FIG. 3, the transistors QP3 cannot produce a current more than the current I1; and moreover, the NOMS transistor QN3 has been tuned on by means of the negative potential VBB supplied to its source and is hardly turned off.

There are some ways to overcome the disadvantage discussed above, such as, providing PMOS transistors QP3 and QP4 having large current capacity or keeping VSS until the low-level side potential VBB is supplied after the transition of the circuit shown in FIG. 2.

The former way, however, increases a layout area on a chip, and the latter increases time for data programming control, etc.

SUMMARY OF THE INVENTION

A purpose of the present invention is to provide a voltage-level shifter having an accurate voltage-level shifting operation with no increase in chip area and time for control.

Another purpose of the present invention is to provide a semiconductor memory housing such a voltage-level shifter.

The present invention provides a voltage-level shifter including: a first power supply terminal to which a first potential is supplied; a second power supply terminal to which a second potential is supplied, the second potential being lower than the first potential; a first input terminal to which a first input signal is supplied, the first input signal having a high and a low level according to the first and the second potentials; a second input terminal to which a second input signal is supplied, the second input signal being an inverted signal of the first input signal; a first PMOS transistor having a source connected to the first power supply terminal, a gate connected to the first input terminal, and a drain connected to a first output terminal for outputting a first output signal; a second PMOS transistor having a source connected to the first power supply terminal, a gate connected to the second input terminal, and a drain connected to a second output terminal for outputting a second output signal that is an inverted signal of the first output signal; a first NMOS transistor having a drain connected to the first output terminal and a gate connected to the first input terminal; a second NMOS transistor having a drain connected to the second output terminal and a gate connected to the second input terminal; a third NMOS transistor having a source connected to the second power supply terminal, a drain connected to the source of the first NMOS transistor, and a gate connected to the second output terminal; and a fourth NMOS transistor having a source connected to the second power supply terminal, a drain connected to the source of the second NMOS transistor, and a gate connected to the first output terminal.

Moreover, the present invention provides a voltage-level shifter including: a first power supply terminal to which a first potential is supplied; a second power supply terminal to which a second potential is supplied, the second potential being lower than the first potential; a first input terminal to which a first input signal is supplied, the first input signal having a high and a low level according to the first and the second potentials; a second input terminal to which a second input signal is supplied, the second input signal being an inverted signal of the first input signal; a first PMOS transistor having a source connected to the first power supply terminal, a gate connected to the first input terminal, and a drain connected to a first output terminal for outputting a first output signal; a second PMOS transistor having a source connected to the first power supply terminal, a gate connected to the second input terminal, and a drain connected to a second output terminal for outputting a second output signal that is an inverted signal of the first output signal; a first NMOS transistor having a drain connected to the first output terminal and a gate connected to the second output terminal; a second NMOS transistor having a drain connected to the second output terminal and a gate connected to the first output terminal; a third NMOS transistor having a source connected to the second power supply terminal, a drain connected to the source of the first NMOS transistor, and a gate connected to the first input terminal; and a fourth NMOS transistor having a source connected to the second power supply terminal, a drain connected to the source of the second NMOS transistor, and a gate connected to the second input terminal.

Furthermore, the voltage-level shifter including: a first power supply terminal to which a first potential is supplied; a second power supply terminal to which a second potential is supplied, the second potential being lower than the first potential; a first input terminal to which a first input signal is supplied, the first input signal having a high and a low level according to the first and the second potentials; a second input terminal to which a second input signal is supplied, the second input signal being an inverted signal of the first input signal; a first NMOS transistor having a source connected to the first power supply terminal, a gate connected to the first input terminal, and a drain connected to a first output terminal for outputting a first output signal; a second NMOS transistor having a source connected to the second power supply terminal, a gate connected to the second input terminal, and a drain connected to a second output terminal for outputting a second output signal that is an inverted signal of the first output signal; a first PMOS transistor having a drain connected to the first output terminal and a gate connected to the first input terminal; a second PMOS transistor having a drain connected to the second output terminal and a gate connected to the second input terminal; a third PMOS transistor having a source connected to the first power supply terminal, a drain connected to the source of the first PMOS transistor, and a gate connected to the second output terminal; and a fourth PMOS transistor having a source connected to the first power supply terminal, a drain connected to the source of the second PMOS transistor, and a gate connected to the first output terminal.

Moreover, the present invention provides a voltage-level shifter including: a first power supply terminal to which a first potential is supplied; a second power supply terminal to which a second potential is supplied, the second potential being lower than the first potential; a first input terminal to which a first input signal is supplied, the first input signal having a high and a low level with respect to the first and the second potentials; a second input terminal to which a second input signal is supplied, the second input signal being an inverted signal of the first input signal; a first NMOS transistor having a source connected to the first power supply terminal, a gate connected to the first input terminal, and a drain connected to a first output terminal for outputting a first output signal; a second NMOS transistor having a source connected to the second power supply terminal, a gate connected to the second input terminal, and a drain connected to a second output terminal for outputting a second output signal that is an inverted signal of the first output signal; a first PMOS transistor having a drain connected to the first output terminal and a gate connected to the second output terminal; a second PMOS transistor having a drain connected to the second output terminal and a gate connected to the first output terminal; a third PMOS transistor having a source connected to the first power supply terminal, a drain connected to the source of the first PMOS transistor, and a gate connected to the first input terminal; and a fourth PMOS transistor having a source connected to the first power supply terminal, a drain connected to the source of the second PMOS transistor, and a gate connected to the second input terminal.

Moreover, the present invention provides a semiconductor memory including: a memory cell array having a plurality of electrically-rewritable memory cells; a decoder that decodes an address signal to output a decoded output signal for selecting at least one of word lines and bit lines of the memory cell array; a first voltage-level shifter that shifts a high level of the decoded output signal for selecting at least one of the word lines to a further high level according to an operation mode to output a first voltage-level shifted output signal; a second voltage-level shifter that shifts a low level of the first voltage-level shifted output signal to a further low level according to the operation mode to output a second voltage-level shifted output signal; and a word line driver that is controlled by the second voltage-level shifted output signal to drive the selected word line, wherein the first voltage-level shifter includes: a first power supply terminal to which a first potential is supplied; a second power supply terminal to which a second potential is supplied, the second potential being lower than the first potential; a first input terminal to which the decoded output signal is supplied, the decoded output signal having a high and a low level according to the first and the second potentials; a second input terminal to which a second input signal is supplied, the second input signal being an inverted signal of the decoded output signal; a first NMOS transistor having a source connected to the first power supply terminal, a gate connected to the first input terminal, and a drain connected to a first output terminal for outputting a first output signal as the first voltage-level shifted output signal; a second NMOS transistor having a source connected to the second power supply terminal, a gate connected to the second input terminal, and a drain connected to a second output terminal for outputting a second output signal that is an inverted signal of the first output signal; a first PMOS transistor having a drain connected to the first output terminal and a gate connected to the first input terminal; a second PMOS transistor having a drain connected to the second output terminal and a gate connected to the second input terminal; a third PMOS transistor having a source connected to the first power supply terminal, a drain connected to the source of the first PMOS transistor, and a gate connected to the second output terminal; and a fourth PMOS transistor having a source connected to the first power supply terminal, a drain connected to the source of the second PMOS transistor, and a gate connected to the first output terminal.

Furthermore, the present invention provides a semiconductor memory including: a memory cell array having a plurality of electrically-rewritable memory cells; a decoder that decodes an address signal to output a decoded output signal for selecting at least one of word lines and bit lines of the memory cell array; a first voltage-level shifter that shifts a high level of the decoded output signal for selecting at least one of the word lines to a further high level according to an operation mode to output a first voltage-level shifted output signal; a second voltage-level shifter that shifts a low level of the first voltage-level shifted output signal to a further low level according to the operation mode to output a second voltage-level shifted output signal; and a word line driver that is controlled by the second voltage-level shifted output signal to drive the selected word line, wherein the second voltage-level shifter includes: a first power supply terminal to which a first potential is supplied; a second power supply terminal to which a second potential is supplied, the second potential being lower than the first potential; a first input terminal to which the first voltage-level shifted output signal is supplied, the first voltage-level shifted output signal having a high and a low level according to the first and the second potentials; a second input terminal to which a second input signal is supplied, the second input signal being an inverted signal of the first voltage-level shifted output signal; a first PMOS transistor having a source connected to the first power supply terminal, a gate connected to the first input terminal, and a drain connected to a first output terminal for outputting a first output signal; a second PMOS transistor having a source connected to the first power supply terminal, a gate connected to the second input terminal, and a drain connected to a second output terminal for outputting a second output signal that is an inverted signal of the first output signal; a first NMOS transistor having a drain connected to the first output terminal and a gate connected to the first input terminal; a second NMOS transistor having a drain connected to the second output terminal and a gate connected to the second input terminal; a third NMOS transistor having a source connected to the second power supply terminal, a drain connected to the source of the first NMOS transistor, and a gate connected to the second output terminal; and a fourth NMOS transistor having a source connected to the second power supply terminal, a drain connected to the source of the second NMOS transistor, and a gate connected to the first output terminal.

Moreover, the present invention provides a semiconductor memory including: a memory cell array having a plurality of electrically-rewritable memory cells; a decoder that decodes an address signal to output a decoded output signal for selecting at least one of word lines and bit lines of the memory cell array; a first voltage-level shifter that shifts a low level of the decoded output signal for selecting at least one of the word lines to a further low level according to an operation mode to output a first voltage-level shifted output signal; a second voltage-level shifter that shifts a high level of the first voltage-level shifted output signal to a further high level according to the operation mode to output a second voltage-level shifted output signal; and a word line driver that is controlled by the second voltage-level shifted output signal to drive the selected word line, wherein the second voltage-level shifter includes: a first power supply terminal to which a first potential is supplied; a second power supply terminal to which a second potential is supplied, the second potential being lower than the first potential; a first input terminal to which the first voltage-level shifted output signal is supplied, the first voltage-level shifted output signal having a high and a low level according to the first and the second potentials; a second input terminal to which a second input signal is supplied, the second input signal being an inverted signal of the first voltage-level shifted output signal; a first NMOS transistor having a source connected to the second power supply terminal, a gate connected to the first input terminal, and a drain connected to a first output terminal for outputting a first output signal as the second voltage-level sifted output signal; a second NMOS transistor having a source connected to the second power supply terminal, a gate connected to the second input terminal, and a drain connected to a second output terminal for outputting a second output signal that is an inverted signal of the first output signal; a first PMOS transistor having a drain connected to the first output terminal and a gate connected to the first input terminal; a second PMOS transistor having a drain connected to the second output terminal and a gate connected to the second input terminal; a third PMOS transistor having a source connected to the first power supply terminal, a drain connected to the source of the first PMOS transistor, and a gate connected to the second output terminal; and a fourth PMOS transistor having a source connected to the first power supply terminal, a drain connected to the source of the second PMOS transistor, and a gate connected to the first output terminal.

Furthermore, the present invention provides a semiconductor memory including: a memory cell array having a plurality of electrically-rewritable memory cells; a decoder that decodes an address signal to output a decoded output signal for selecting at least one of word lines and bit lines of the memory cell array; a first voltage-level shifter that shifts a low level of the decoded output signal for selecting at least one of the word lines to a further low level according to an operation mode to output a first voltage-level shifted output signal; a second voltage-level shifter that shifts a high level of the first voltage-level shifted output signal to a further high level according to the operation mode to output a second voltage-level shifted output signal; and a word line driver that is controlled by the second voltage-level shifted output signal to drive the selected word line, wherein the first voltage-level shifter includes: a first power supply terminal to which a first potential is supplied; a second power supply terminal to which a second potential is supplied, the second potential being lower than the first potential; a first input terminal to which the decoded output signal is supplied, the decoded output signal having a high and a low level according to the first and the second potentials; a second input terminal to which a second input signal is supplied, the second input signal being an inverted signal of the first voltage-level shifted output signal; a first PMOS transistor having a source connected to the first power supply terminal, a gate connected to the first input terminal, and a drain connected to a first output terminal for outputting a first output signal as the first voltage-level shifted output signal; a second PMOS transistor having a source connected to the first power supply terminal, a gate connected to the second input terminal, and a drain connected to a second output terminal for outputting a second output signal that is an inverted signal of the first output signal; a first NMOS transistor having a drain connected to the first output terminal and a gate connected to the first input terminal; a second NMOS transistor having a drain connected to the second output terminal and a gate connected to the second input terminal; a third NMOS transistor having a source connected to the second power supply terminal, a drain connected to the source of the first NMOS transistor, and a gate connected to the second output terminal; and a fourth NMOS transistor having a source connected to the second power supply terminal, a drain connected to the source of the second NMOS transistor, and a gate connected to the first output terminal.

According to the present invention, providing transistors controlled by an input signal for current restriction along the current path in a voltage-level shifter having a pair of PMOS transistors and another pair of NMOS transistors, achieves an accurate voltage-level shifting operation.

The transistors for current restriction are NMOS transistors for shifting a low-level side of an input signal to a further low level whereas they are PMOS transistors for shifting a high-level side of an input signal to a further high level.

Provision of these transistors for current restriction requires a layout area smaller than that for increasing current capacity of transistors to be switched by an input signal.

Moreover, the present invention achieves shortening of time for a voltage-level shifting control compared to voltage-level shifting after a voltage-level shifter is switched, thus producing no unnecessary delay in operation mode control for a semiconductor device housing the voltage-level shifter according to the present invention.

DETAILED DESCRIPTION OF PREFERRED EMBODIMENTS

Preferred embodiments according to the present invention will be disclosed with reference to the attached drawings.

[The First Embodiment]

Figure 4:
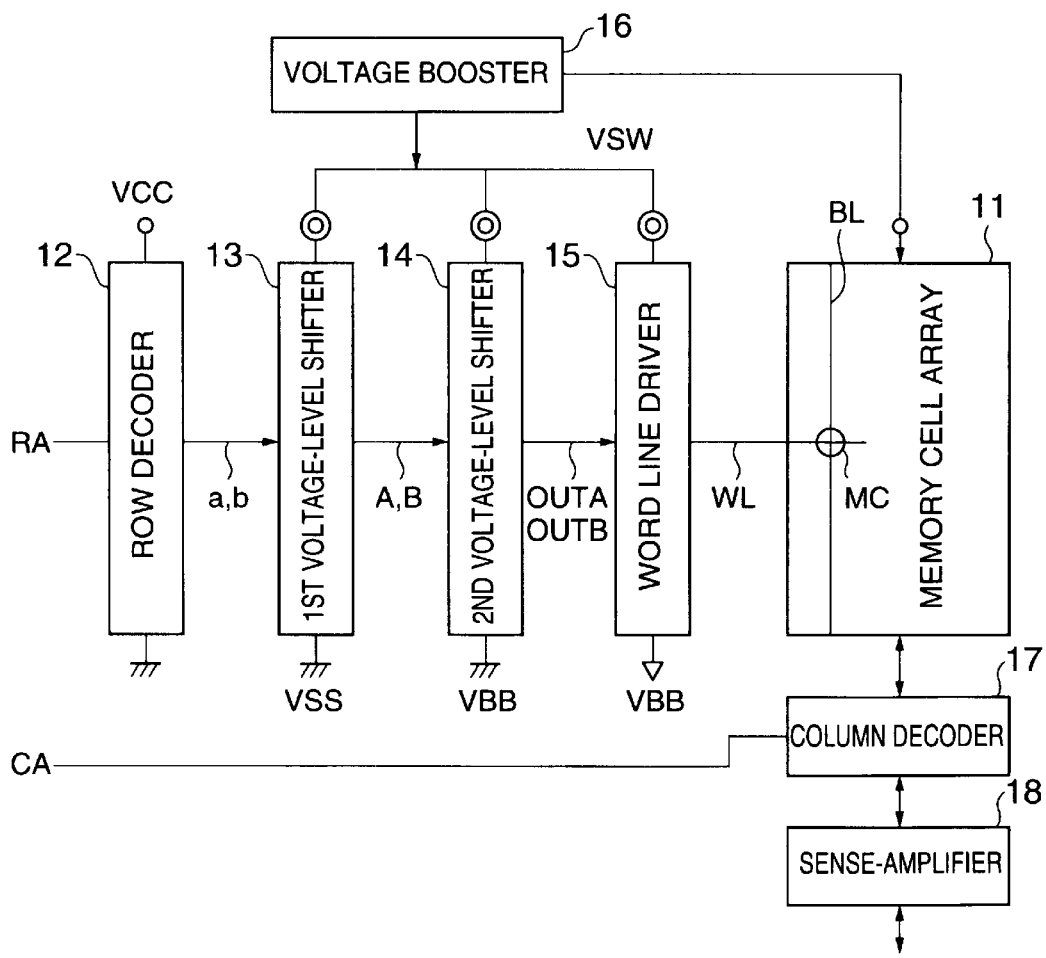
FIG. 4 shows a block diagram in which the present invention is applied to an EEPROM.

FIG. 4 shows a block diagram in which the present invention is applied to an EEPROM.

A memory cell array 11 is provided with a plurality of bit lines BL and word lines WL intersecting each other and a memory cell MC located at each intersection.

The word lines WL and the bit lines BL are selected by a row decoder 12 and a column decoder 17, respectively. Bit lines BL selected by the column decoder 17 in response to a column address signal CA are connected to a sense-amplifier 18.

In response to a row address signal RA, the row decoder 12 outputs complementary decoded signals "a" and "b" having an amplitude (VCC−VSS) where VCC and VSS denote a power supply potential and a ground potential, respectively.

The high-level side potential VCC of each of the output signals "a" and "b" is shifted to a further higher potential VSW by a first voltage-level shifter 13. Complementary output signals "A" and "B" of the voltage level shifter 13 have an amplitude (VSW−VSS).

The low-level side potential VSS of each of the output signals "A" and "B" is shifted to a further lower potential VBB by a second voltage-level shifter 14. Complementary output signals "OUTA" and "OUTB" of the voltage-level shifter 14 have an amplitude (VSW−VBB).

The high-level potential VSW is generated by a voltage booster 16 that has a voltage regulator (not shown) generating several levels of the potential VSW.

At least either one of the output signals "OUTA" and "OUTB" is supplied to a word line driver 15 having a CMOS driver, although not shown, constituted by PMOS and NMOS transistors at the high- and low-level sides, respectively. The word line driver 15 outputs a word line-driving signal to the memory cell array 11 according to the output of the second voltage level shifter 14.

Figure 5:
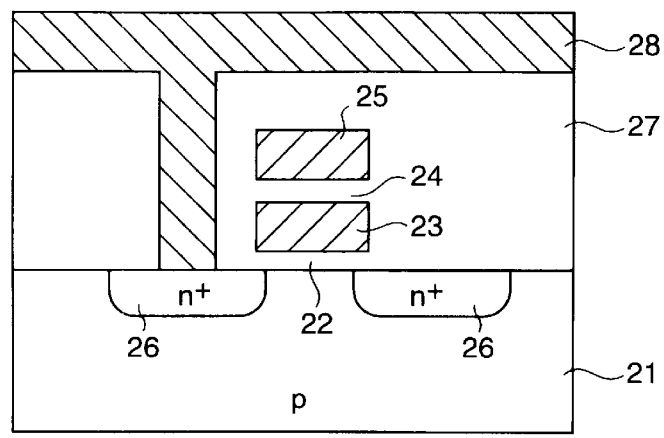
FIG. 5 illustrates a structure of a memory cell shown in FIG. 4.

Each memory cell MC has a structure as illustrated in FIG. 5. A floating gate 23 (a charge storage layer) is formed over a well structure, or a p-type region in a silicon substrate 21 via a tunnel insulating film 22. Stacked on the floating gate 23 via a gate insulating 24 is a control gate 25 that is continuously formed in one direction to form a word line. Formed with the control gate 25 by self-alignment is source and drain diffusion layers 26. The memory cell transistor is covered with an inter-layer insulating film 27 formed with a bit line 28 thereon.

Figure 6:
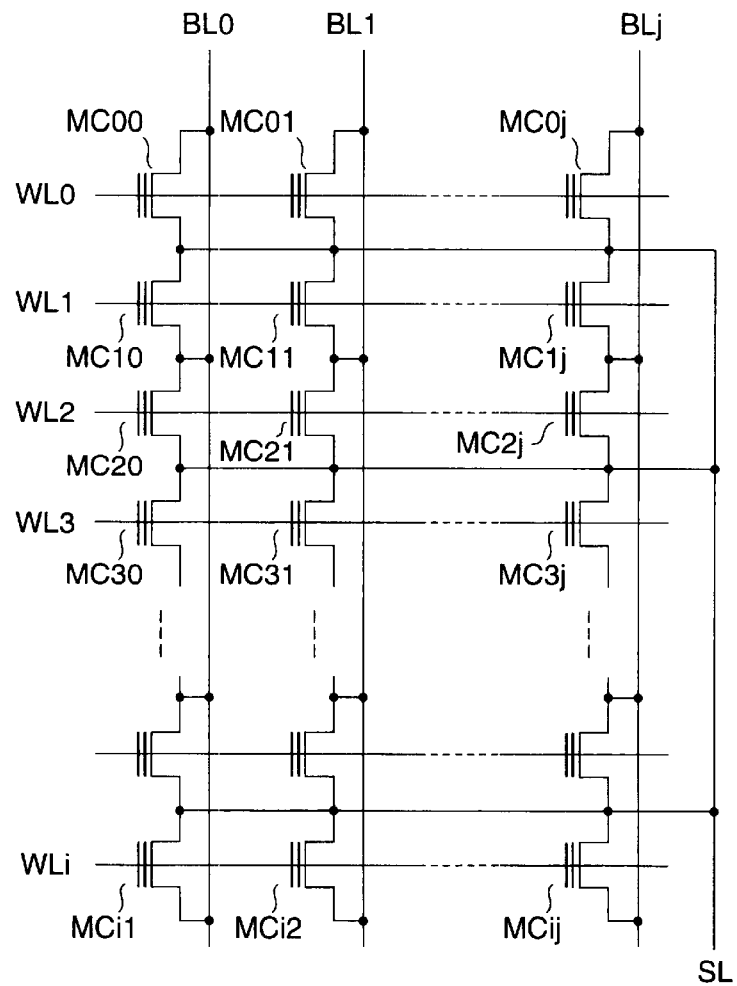
FIG. 6 shows an equivalent circuit of a memory cell array shown in FIG. 4.

An equivalent circuit of the memory cell array 11 for a NOR-type EEPROM is shown in FIG. 6.

A plurality of bit lines BL and word lines WL intersect each other with a memory cell MCij at each intersection. The drain and source of the memory cell MCij are connected to a bit line BL and a common source line SL, respectively.

Figure 7:
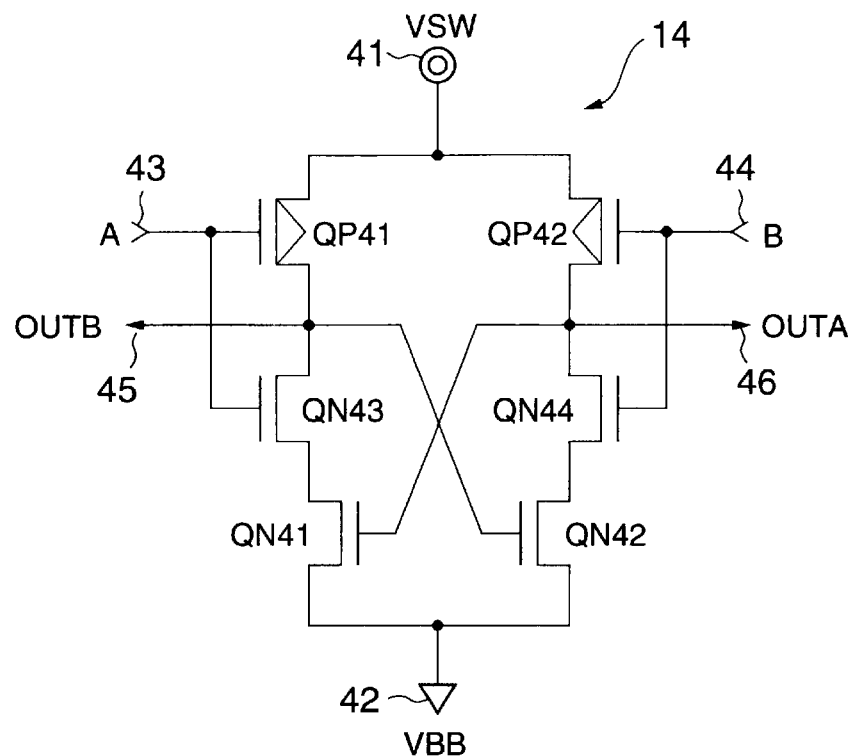
FIG. 7 shows a circuit diagram of a first embodiment of a voltage-level shifter according to the present invention.

A circuit diagram of the second voltage-level shifter 14 (FIG. 4) is shown on FIG. 7.

The voltage-level shifter 14 is provided with a switching stage of a PMOS transistor pair QP41 and QP42, the sources of which are connected to a high-level side power supply terminal 41. The gates of the transistors QP41 and QP42 are connected to terminals 43 and 44 to which the complementary output signals "A" and "B" are supplied, respectively, from the first voltage-level sifter 13. The drains of the transistors QP41 and QP42 are connected to output terminals 45 and 46, respectively.

The sources of an NMOS transistor pair QN41 and QN42 are connected to a low-level power supply terminal 42, the gates of which are cross-connected to the output terminals 46 and 45, respectively, for shifting output signals appearing at the terminals 45 and 46 to a low level according to the input signals.

Connected between the drains of the NMOS transistor pair QN41 and QN42 and those (the output terminal 45 and 46) of the PMOS transistor pair QP41 and QP42 are an NMOS transistor pair QN43 and QN44 for current restriction. The drains of the transistors QN43 and QN44 are connected to the output terminal 45 and 46, respectively, the sources of which are connected to the drains of the NMOS transistors QN41 and QN42, respectively. The gates of the transistors QN43 and QN44 are connected to the input terminal 43 and 44, respectively.

As disclosed above, the complementary signals "A" and "B" supplied to the second voltage-level shifter 14 are VSW and VSS at the high- and low-level sides, respectively.

The second voltage-level shifter 14 receives VSW and the negative potential VBB at the high-level side power supply terminal 41 and the low-level side power supply terminal 42, respectively, to output signals OUTA and OUTB for which the low level VSS of each of the input signals "A" and "B" is shifted to the further low level VBB.

An operation of the second voltage-level shifter 14 is disclosed.

Figure 8:
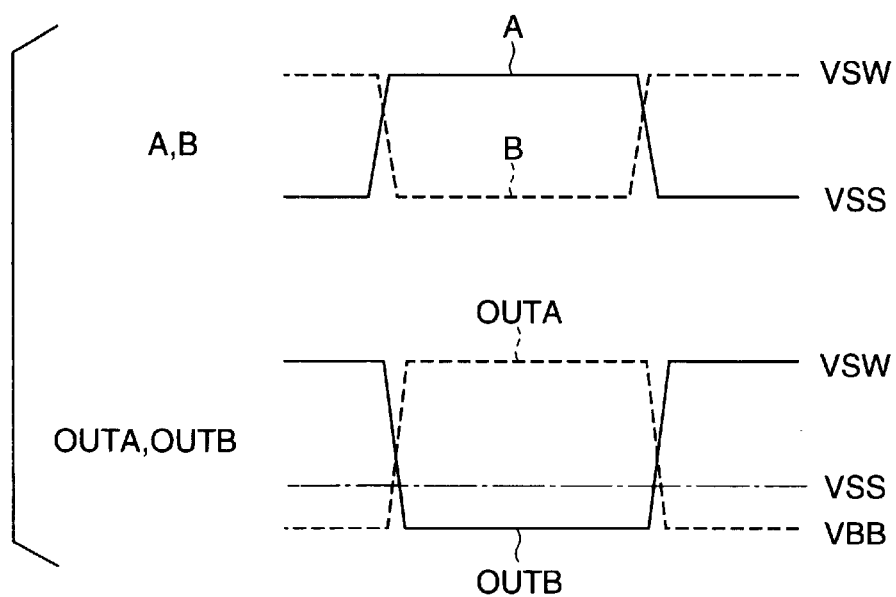
FIG. 8 shows signal waveforms for the voltage-level sifter shown in FIG. 7.

Suppose that the voltage-level shifter 14 is now in a stable state at input signals "A"=VSW and "B"=VSS. In this stable state, the PMOS transistors QP41 and QP42 are turned off and on, respectively, and the NMOS transistors QN41 and QN 43 are turned on while the NMOS transistors QN42 and QN 44 are turned off, thus OUTA=VSW and OUTB=VBB at the output terminals 46 and 45, respectively, as shown in FIG. 8.

Suppose next that the input signals "A" and "B" are shifted to VSS and VSW, respectively. The PMOS transistors QP41 and QP42 are then turned on and off, respectively. A voltage increase at the output terminal 45 is supplied to the gate of the NMOS transistor QN42 whereas a voltage decrease at the output terminal 46 is supplied to the gate of the NMOS transistor QN41. The NMOS transistor QN41 and QN42 are thus turned off and on, respectively. Simultaneously, the NMOS transistors QN43 and QN44 are turned off and on, respectively, by the input signals "A" and "B".

The transition of the NMOS transistors QN41 and QN42 from on to off and off to on, respectively, achieves a positive feed-back operation to stimulate voltage shift at the output terminals 45 and 46 in which the output signals OUTA and OUTB gradually become VBB and VSW, respectively.

Figure 9:
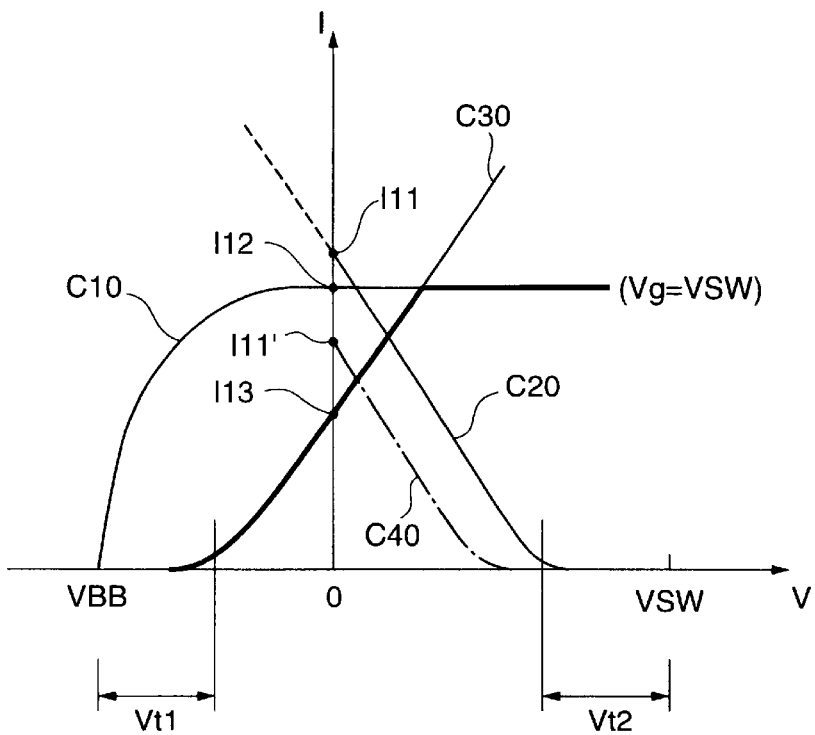
FIG. 9 represents current-to-voltage characteristics for the voltage-level shifter shown in FIG. 7.

An accurate voltage shift operation of the voltage-level shifter 14 (FIG. 7) disclosed so far is discussed further in detail with respect to current-to-voltage characteristics shown in FIG. 9 with respect to the current path along the PMOS transistor QP41 side.

A curve C10 represents a static characteristic curve of the NMOS transistor QN41 at Vg=VSW. A curve C20 represents a load characteristic curve of the PMOS transistor QP41 controlled by the input signal "A" and being a load against the NMOS transistor QN41. A curve C30 represents a load characteristic curve of the NMOS transistor QN43 also controlled by the input signal "A".

Gate threshold voltages for the NMOS transistor QN43 and the PMOS transistor QP41 are Vt1 and Vt2, respectively.

A composite current flowing through the series-connected NMOS transistors QN41 and QN43 is represented by a thick solid line, which depends on a smaller current flowing through either the transistor QN41 or QN43. Compared to a current I12 at 0 V on the static characteristic curve C10, a composite current I13 becomes small at 0 V to the NMOS transistors QN41 and QN43.

If the NMOS transistors QN43 and QN44 are not provided, like the circuit shown in FIG. 2, it is required that a current I11 at 0 V on the load characteristic curve C20 is larger than a current I12 at 0 V on the static characteristic curve C10, as discussed with reference to FIG. 3. A low (high-level side) potential VSW varied according to an operation mode would provide a load characteristic curve as a dashed line C40 which does not to meet the requirement I11>I12.

On the contrary, the circuit shown in FIG. 7 meets the requirement in that, even if the load characteristic curve C40 is provided due to a current restriction operation of the NMOS transistor QN42, a current I11' at 0 V is kept higher than the composite current I13 to the NMOS transistors QN41 and QN43. The voltage-level shifter 14 according to the present invention therefore achieves an accurate voltage shift operation over a wide range of the high-level side potential VSW.

As disclosed above, the requirement for an accurate voltage shift operation according to this embodiment is that current I12 on the static characteristic curve C10 is larger than the current I13 on the load characteristic curve C30 at 0 V in FIG. 8.

The foregoing discussion on the requirement is also applied to the current path along the PMOS transistor QP42 side of the voltage-level sifter 14 shown in FIG. 7.

This requirement is met by correctly adjusting the threshold levels Vt1 for the NMOS transistors QN43 and QN44, transistor size and so on, with respect to the potentials VSW and VBB.

Figure 1:
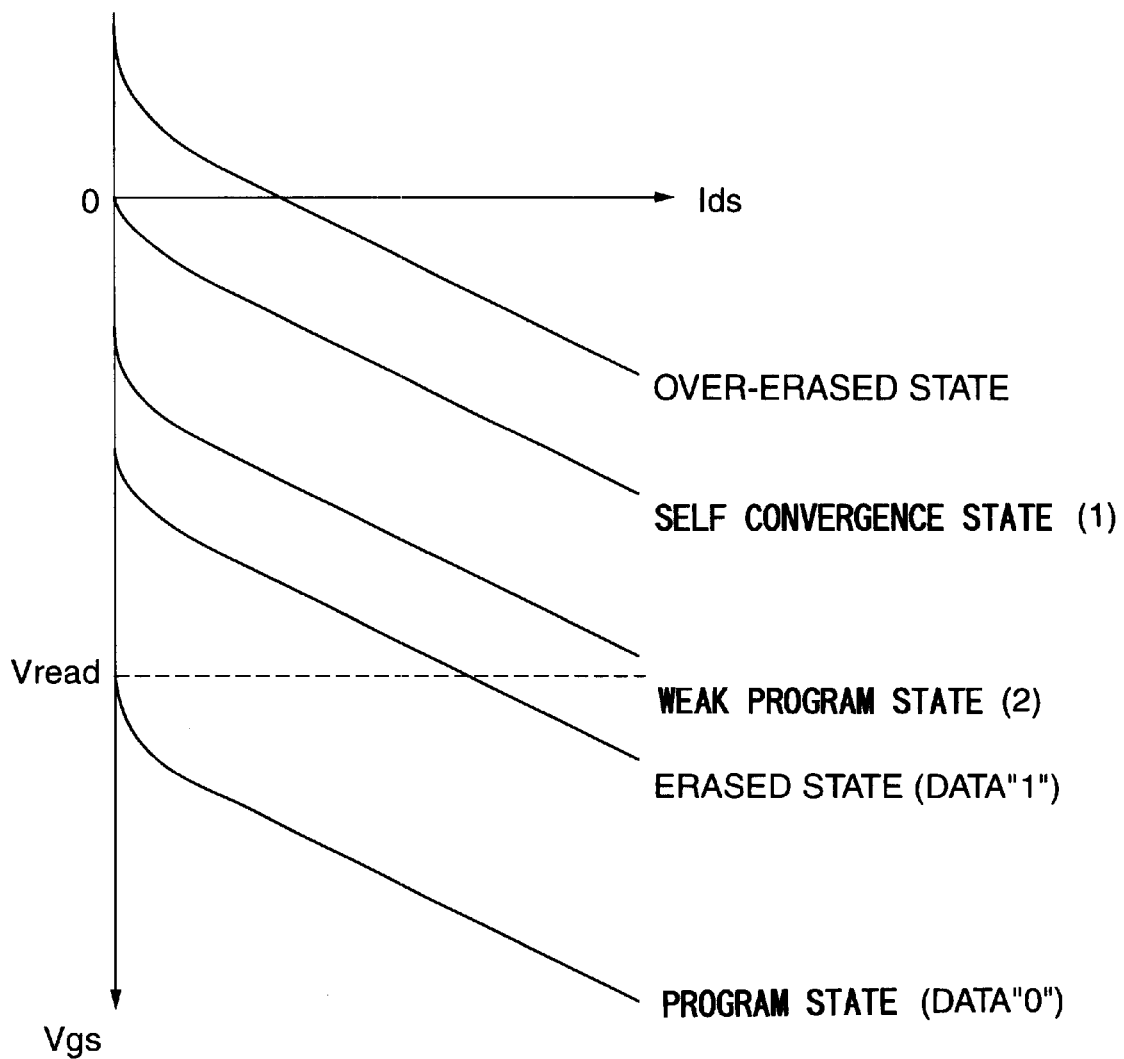
FIG. 1 represents Vgs-to-Ids characteristics for several states of a well-known EEPROM.
Figure 2:
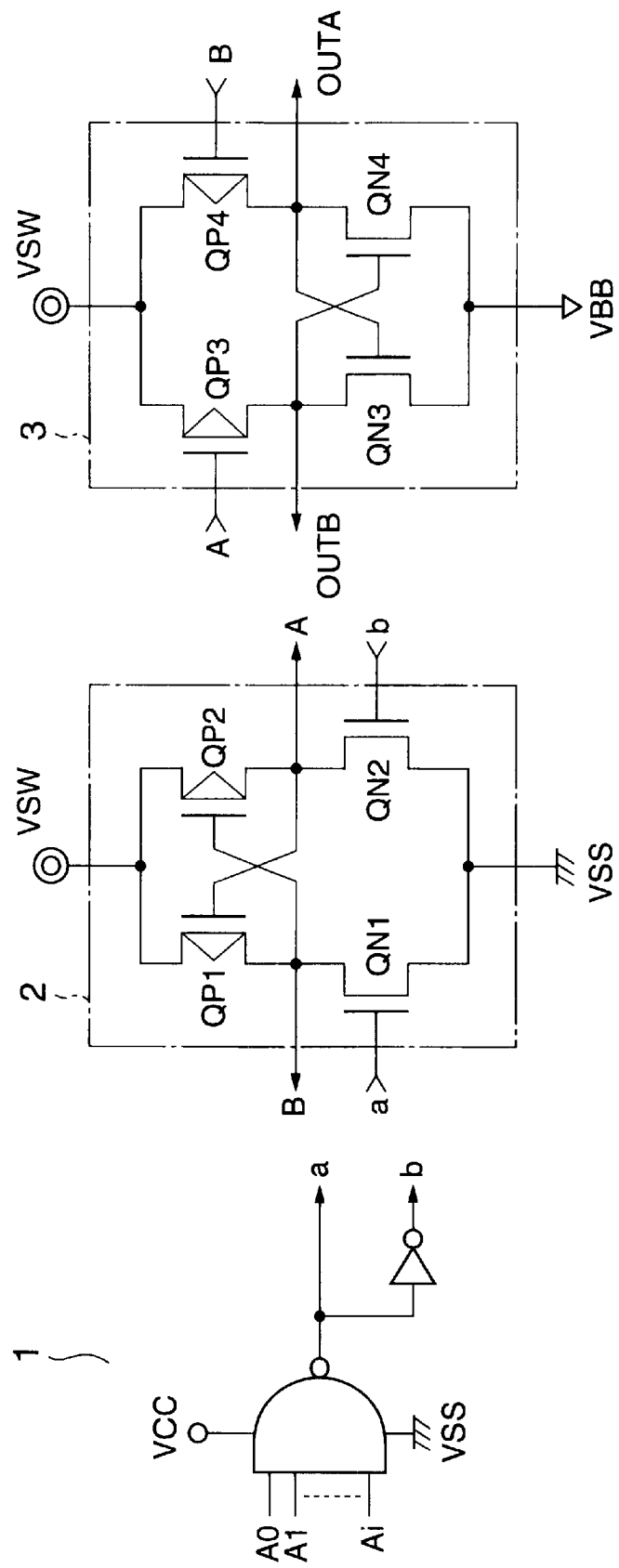
FIG. 2 shows a circuit diagram of a row decoder for a well-known EEPROM.
Figure 3:
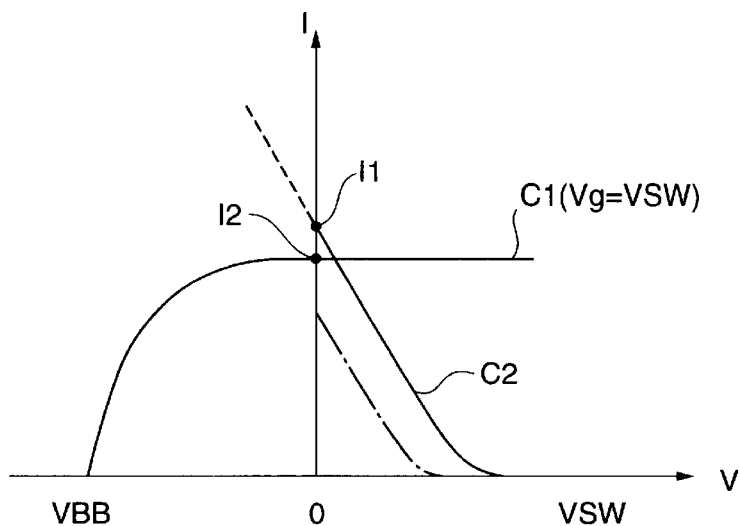
FIG. 3 represents voltage-to-current characteristics of a level-shifter shown in FIG. 2.

Compared to the circuit shown in FIG. 2, the circuit shown in FIG. 7 requires the NMOS transistors QN43 and QN44. However, increase in chip area for those transistors is smaller than that for achieving a large current density by having a wide gate for the switching transistors QP41 and QP42.

Moreover, the voltage-level shifter according to this embodiment requires no operation such as supplying a low-level potential VBB for voltage-level shifting after the transistors are switched, thus achieving decrease in operation time for a high-speed EEPROM.

Moreover, the voltage-level shifter according to this embodiment achieves restriction on a tunnel current by means of the NMOS transistors QN41 and QN42.

[The Second Embodiment]

Figure 10:
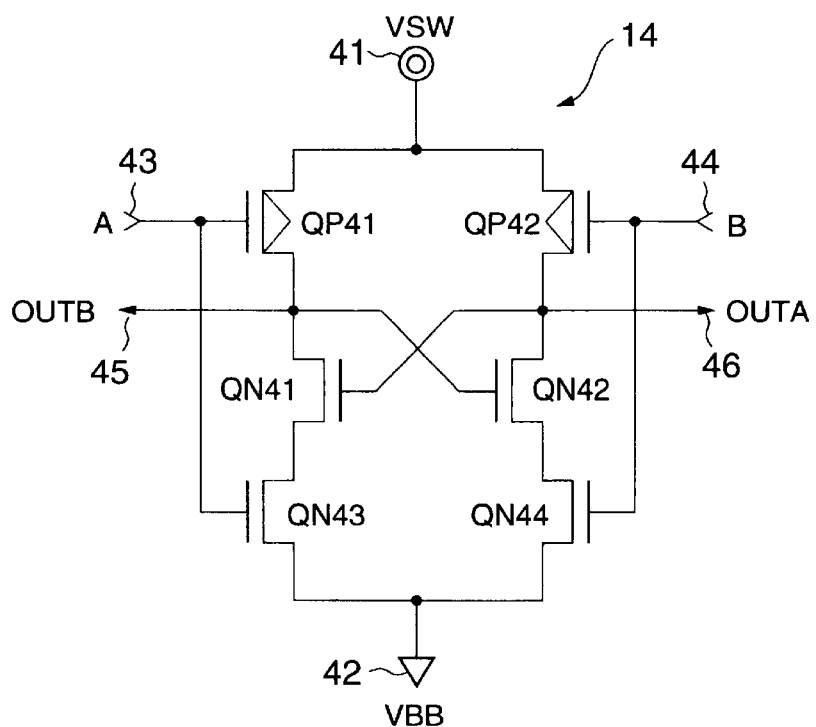
FIG. 10 shows a circuit diagram of the second preferred embodiment of a voltage-level shifter according to the present invention.

FIG. 10 shows a block diagram of the second preferred embodiment of a voltage-level shifter according to the present invention.

Elements in this embodiments that are the same as or analogous to elements in the first embodiment (FIG. 7) are referenced by the same reference numbers and will not be explained in detail.

The difference between the first and the second embodiments is that the NMOS transistors QN41 and QN43 are reversed to each other, the same going to the NMOS transistors QN42 and QN44. In other words, the NMOS transistors QN43 and QN44 to be controlled by input signals for current restriction are provided between the sources of the NMOS transistors QN41 and QN42 that constitute a flip-flop for low-level shifting and the low-level side power supply terminal 42.

Like the first embodiment, the second embodiment achieves an accurate voltage-level shift operation.

In the first embodiment shown in FIG. 7, forming the substrate regions of the NMOS transistors QN41, QN42, QN43 and QN44 as a p-type region and connecting them to the power terminal 42 produces a back-gate bias to the transistors QN43 and QN44 to raise their threshold voltages for a stable voltage-level shift operation discussed with reference to FIG. 9.

Contrary to this, forming the substrate regions of those NMOS transistors as a p-type region and connecting them to the power terminal 42 in the second embodiment (FIG. 10) produces a back-gate bias to the transistors QN41 and QN42, which will, however, not obstruct a stable voltage-level shift operation.

[The Third Embodiment]

The first and second embodiments disclosed so far are applied to the second voltage shifter 14 shown in FIG. 4. The present invention is, however, applicable to the first voltage-level shifter 13 shown in FIG. 4 for high-level side voltage-level shifting.

Figure 11:
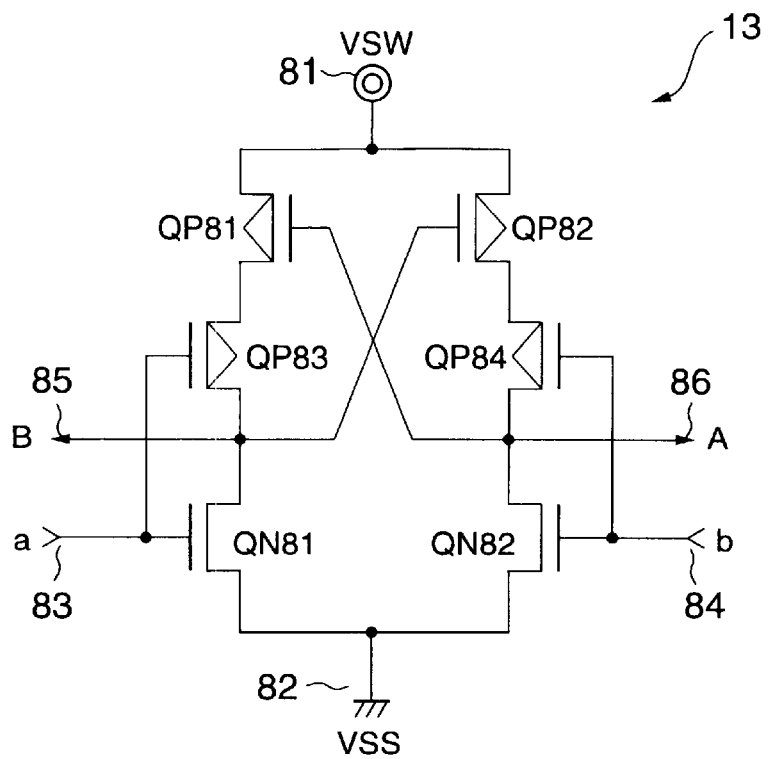
FIG. 11 shows a circuit diagram of the third preferred embodiment of a voltage level shifter according to the present invention.

FIG. 11 shows a block diagram of the third preferred embodiment of a voltage level shifter according to the present invention, which is applicable, for example, to the first voltage shifter 13.

The voltage-level sifter 13 is provided with a switching stage of a NMOS transistor pair QN81 and QN82, the sources of which are connected to a low-level side power supply terminal 82. The gates of the transistors QN81 and QN82 are connected to terminals 83 and 84 to which the complementary output signals "a" and "b" are supplied, respectively, from the row decoder 12 (FIG. 4). The drains of the transistors QN81 and QN82 are connected to output terminals 85 and 86, respectively.

The sources of a PMOS transistor pair QP81 and QP82 are connected to a high-level power supply terminal 81, the gates of which are cross-connected to the output terminals 86 and 85, respectively, for shifting output signals appearing at the terminals 85 and 86 to a high level according to the input signals.

Connected between the drains of the PMOS transistor pair QP81 and QP82 and those (the output terminal 85 and 86) of the NMOS transistor pair QN81 and QN82 are a PMOS transistor pair QP83 and QP84 for current restriction. The drains of the transistors QP83 and QP84 are connected to the output terminal 85 and 86, respectively, the sources of which are connected to the drains of the PMOS transistors QP81 and QP82, respectively. The gates of the transistors QP83 and QP84 are connected to the input terminal 83 and 84, respectively.

Like disclosed above, the complementary signals "a" and "b" supplied to the first voltage-level shifter 13 are VCC and VSS at the high and low-level sides, respectively.

The first voltage-level shifter 13 receives the VSW and VSS at the high-level side power supply terminal 81 and the low-level side power supply terminal 82, respectively, to output signals "A" and "B" for which the high level VCC of each of the input signal "a" and "b" is shifted to the further high level VSW.

The first voltage-level shifter 13 operates basically the same as the second voltage-level shifter 14 shown in FIG. 7. The difference is that the second voltage-level shifter 14 shifts a lower level of the input signal "A" and "B" to further lower whereas the first voltage-level shifter 13 shifts a higher level of the input signal "a" and "b" to further higher, as illustrated in FIG. 12.

Figure 12:
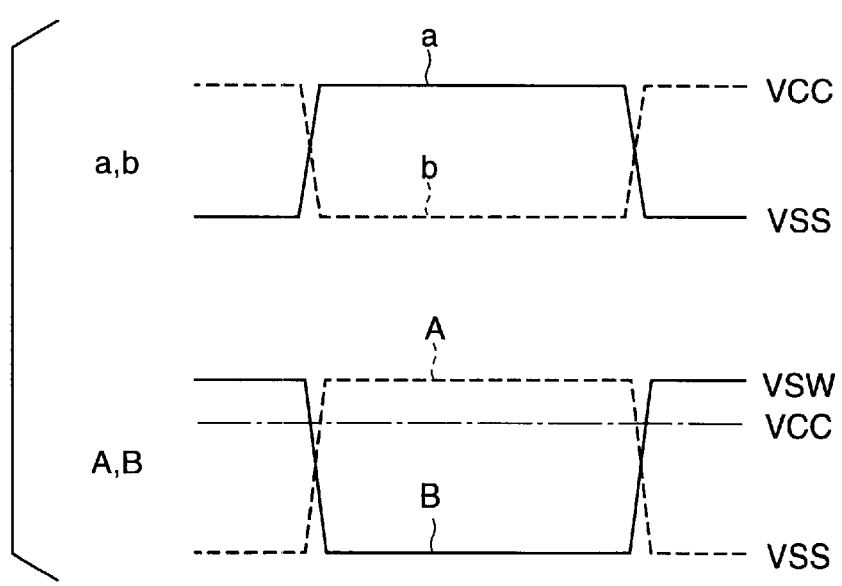
FIG. 12 shows signal waveforms for the voltage-level sifter shown in FIG. 11.

The operation of the first voltage shifter 13 shown in FIG. 11 is understood by any person skilled in the art with reference to the disclosure for the second voltage shifter 14 shown in FIG. 7 and also FIG. 12, hence description for the first voltage shifter 13 is omitted for brevity.

The third embodiment also achieves a stable voltage-level shift operation like the foregoing embodiments.

[The Fourth Embodiment]

Figure 13:
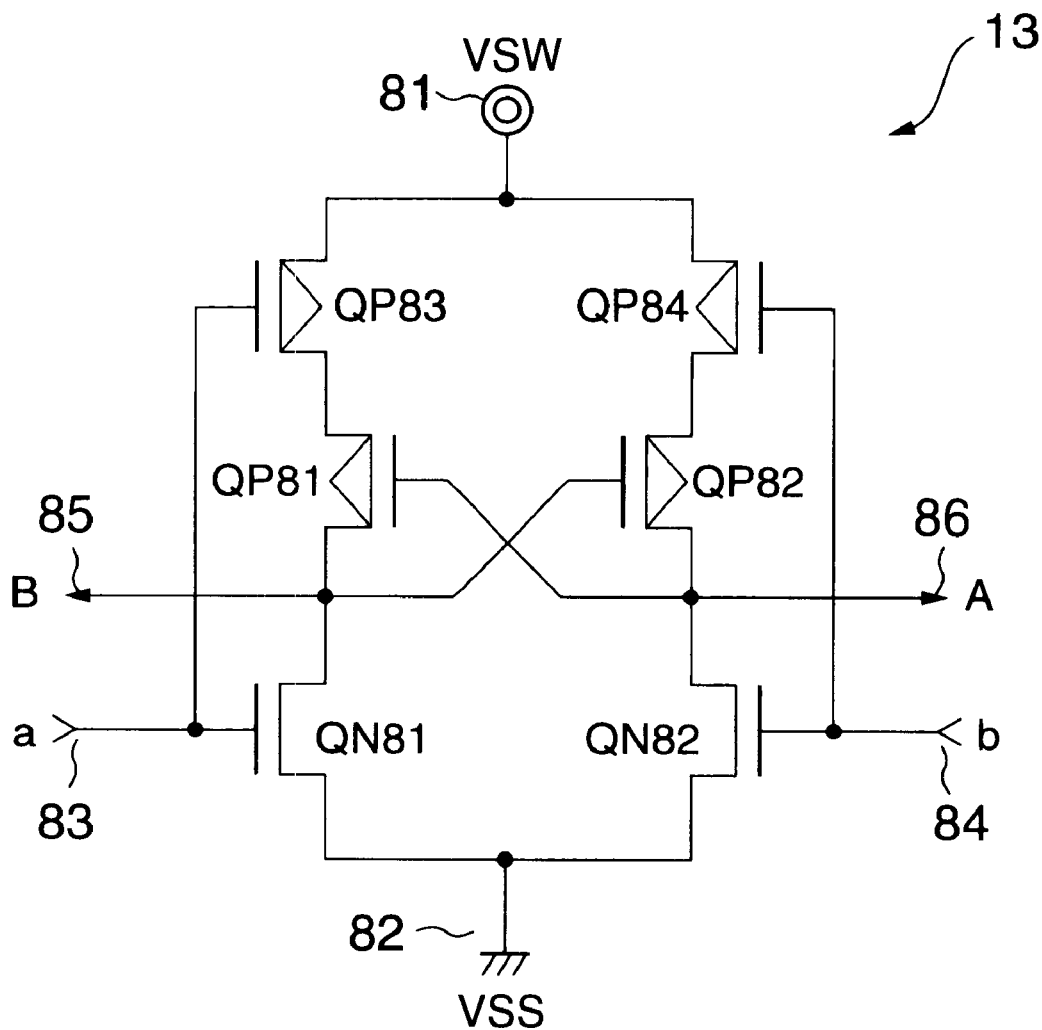
FIG. 13 shows a circuit diagram of the fourth preferred embodiment of a voltage level shifter according to the present invention.

FIG. 13 shows a block diagram of the fourth preferred embodiment of a voltage level shifter according to the present invention, which is a modification to the third embodiment (FIG. 11).

The locations of the PMOS transistors QP81 and QP83 and also PMOS transistors QP84 and QP82 are revered to each other between the third and the fourth embodiments shown in FIGS. 11 and 13, respectively.

In other words, in FIG. 13, the PMOS transistors QP83 and QP84 to be controlled by the input signals for current restriction are provided between the high-level side power supply terminal 81 and the sources of the PMOS transistors QP81 and QP82 connected in a flip-flop for lower-level shifting.

The operational relationship between the embodiments shown in FIGS. 11 and 13 are the same as that between the embodiments shown in FIGS. 7 and 10, hence the fourth embodiment also achieves a stable voltage level shifting, like the foregoing embodiments.

Although disclosed in detail as above, the present invention is not limited to the foregoing embodiments.

The voltage level shifters shown in FIGS. 7 and 10 are disclosed as for shifting only a low-level potential of the input signals. The present invention is, however, applicable to shifting a high-level potential of the input signals to a lower level when a high-level input potential is higher than the high-level side potential VSW.

Moreover, the voltage level shifters shown in FIGS. 11 and 13 are disclosed as for shifting only a high-level potential of the input signals. The present invention is, however, applicable to shifting a low-level potential of the input signals to higher level when a low-level input potential is higher than the low-level side potential VSS.

In FIG. 4, the first voltage-level shifter 13 and the second voltage-level shifter 14 can be replaced with each other, causing no problems.

The foregoing embodiments are disclosed as applied to a NOR-type EEPROM, however, the present invention is also applicable to a NAND-type EEPROM and DRAM that require controlling a control signal level.

Furthermore, not only a semiconductor memory, the present invention is applicable to several types of semiconductor device.

As disclosed above, according to the present invention, current-restricting transistors that are controlled by an input signal are provided along current paths of a voltage-level shifter constituted by a PMOS transistor pair and an NMOS transistor pair, achieving an accurate voltage-level shifting.

What is claimed is:

1. A voltage-level shifter comprising:

a first power supply terminal to which a first potential is supplied;

a second power supply terminal to which a second potential is supplied, the second potential being lower than the first potential;

a first input terminal to which a first input signal is supplied, the first input signal having a high and a low level according to the first and the second potentials;

a second input terminal to which a second input signal is supplied, the second input signal being an inverted signal of the first input signal;

a first PMOS transistor having a source connected to the first power supply terminal, a gate connected to the first input terminal, and a drain connected to a first output terminal for outputting a first output signal;

a second PMOS transistor having a source connected to the first power supply terminal, a gate connected to the second input terminal, and a drain connected to a second output terminal for outputting a second output signal that is an inverted signal of the first output signal;

a first NMOS transistor having a drain connected to the first output terminal and a gate connected to the second output terminal;

a second NMOS transistor having a drain connected to the second output terminal and a gate connected to the first output terminal;

a third NMOS transistor having a source connected to the second power supply terminal, a drain connected to the source of the first NMOS transistor, and a gate connected to the first input terminal; and a fourth NMOS transistor having a source connected to the second power supply terminal, a drain connected to the source of the second NMOS transistor, and a gate connected to the second input terminal.

2. The voltage-level shifter according to claim 1, wherein the high level of the first input signal is a third potential that is equal to or higher than the first potential and the low level of the first input signal is a fourth potential that is lower than the first potential but higher than the second potential, each of the first and the second output signals having a potential equal to the first or the second potential.

3. A voltage-level shifter comprising:

a first power supply terminal to which a first potential is supplied;

a second power supply terminal to which a second potential is supplied, the second potential being lower than the first potential;

a first input terminal to which a first input signal is supplied, the first input signal having a high and a low level according to the first and the second potentials;

a second input terminal to which a second input signal is supplied, the second input signal being an inverted signal of the first input signal;

a first NMOS transistor having a source connected to the first power supply terminal, a gate connected to the first input terminal, and a drain connected to a first output terminal for outputting a first output signal;

a second NMOS transistor having a source connected to the, second power supply terminal, a gate connected to the second input terminal, and a drain connected to a second output terminal for outputting a second output signal that is an inverted signal of the first output signal;

a first PMOS transistor having a drain connected to the first output terminal and a gate connected to the second output terminal;

a second PMOS transistor having a drain connected to the second output terminal and a gate connected to the first output terminal;

a third PMOS transistor having a source connected to the first power supply terminal, a drain connected to the source of the first PMOS transistor, and a gate connected to the first input terminal; and a fourth PMOS transistor having a source connected to the first power supply terminal, a drain connected to the source of the second PMOS transistor, and a gate connected to the second input terminal.

4. The voltage-level shifter according to claim 3, wherein the high level of the first input signal is a third potential that is lower than the first potential but higher than the second potential and the low level of the first input signal is a fourth potential equal to or lower than the second, each of the first and the second output signals having a potential equal to the first or the second potential.

* * * * *